(12) United States Patent
Carlson

(10) Patent No.: US 9,825,199 B2
(45) Date of Patent: Nov. 21, 2017

(54) LASER-TRANSFERRED IBC SOLAR CELLS

(71) Applicant: Natcore Technology, Inc., Rochester, NY (US)

(72) Inventor: David E. Carlson, Williamsburg, VA (US)

(73) Assignee: NATCORE TECHNOLOGY, INC., Rochester, NY (US)

( * ) Notice: Subject to any disclaimer, the term of this patent is extended or adjusted under 35 U.S.C. 154(b) by 0 days.

(21) Appl. No.: 15/392,163

(22) Filed: Dec. 28, 2016

(65) Prior Publication Data

US 2017/0110623 A1    Apr. 20, 2017

Related U.S. Application Data

(62) Division of application No. 14/800,015, filed on Jul. 15, 2015, now Pat. No. 9,570,638.

(Continued)

(51) Int. Cl.
*B23K 26/36* (2014.01)
*H01L 31/18* (2006.01)
(Continued)

(52) U.S. Cl.
CPC ...... *H01L 31/1876* (2013.01); *B23K 26/0622* (2015.10); *B23K 26/0876* (2013.01); *B23K 26/36* (2013.01); *B23K 26/361* (2015.10); *B23K 26/362* (2013.01); *B23K 26/402* (2013.01); *G02B 26/106* (2013.01); *H01L 31/02167* (2013.01); *H01L 31/022441* (2013.01); *H01L 31/022458* (2013.01); *H01L 31/061* (2013.01); *H01L 31/0682* (2013.01); *H01L 31/1804* (2013.01); *H01L 31/1892* (2013.01); *H01L 31/202* (2013.01); *B23K 2201/40* (2013.01);
(Continued)

(58) Field of Classification Search
CPC .......... H01L 31/0201; H01L 31/02021; H01L 31/02167; H01L 31/022433; H01L 31/022441; H01L 31/022458; H01L 31/0682; H01L 31/1804; H01L 31/1876; H01L 31/1892; H01L 31/202; B23K 26/0622; B23K 26/0876; B23K 26/36; B23K 26/402; B23K 26/57; B23K 2201/40; B23K 2201/42; B23K 2203/50
See application file for complete search history.

(56) References Cited

U.S. PATENT DOCUMENTS 8,728,589 B2 * 5/2014 Auyeung ............... H05K 3/046
427/595

FOREIGN PATENT DOCUMENTS

DE   102008057228 A1 *  7/2009 ........... C23C 14/048
DE   102013204465 A1 *  9/2014 ..... H01L 31/022425
JP      2006-310635 A *  11/2006

* cited by examiner

*Primary Examiner* — Stephen W Smoot
(74) *Attorney, Agent, or Firm* — Winstead PC

(57) ABSTRACT

A laser processing system can be utilized to produce high-performance interdigitated back contact (IBC) solar cells. The laser processing system can be utilized to ablate, transfer material, and/or laser-dope or laser fire contacts. Laser ablation can be utilized to remove and pattern openings in a passivated or emitter layer. Laser transferring may then be utilized to transfer dopant and/or contact materials to the patterned openings, thereby forming an interdigitated finger pattern. The laser processing system may also be utilized to plate a conductive material on top of the transferred dopant or contact materials.

20 Claims, 3 Drawing Sheets

Related U.S. Application Data

(60) Provisional application No. 62/024,784, filed on Jul. 15, 2014.

(51) Int. Cl.
 *H01L 31/0224* (2006.01)
 *H01L 31/20* (2006.01)
 *H01L 31/068* (2012.01)
 *B23K 26/362* (2014.01)
 *B23K 26/402* (2014.01)
 *B23K 26/08* (2014.01)
 *B23K 26/0622* (2014.01)
 *H01L 31/061* (2012.01)
 *G02B 26/10* (2006.01)
 *H01L 31/0216* (2014.01)
 *B23K 26/361* (2014.01)
 *B23K 103/00* (2006.01)
 *B23K 101/40* (2006.01)
 *B23K 101/42* (2006.01)

(52) U.S. Cl.
 CPC ...... *B23K 2201/42* (2013.01); *B23K 2203/50* (2015.10); *B23K 2203/56* (2015.10); *Y02E 10/547* (2013.01); *Y02P 70/521* (2015.11)

LASER-TRANSFERRED IBC SOLAR CELLS

RELATED APPLICATIONS

This application is a divisional of U.S. patent application Ser. No. 14/800,015 filed on Jul. 15, 2015 and issued as U.S. Pat. No. 9,570,638, which claims the benefit of U.S. Provisional Patent Application No. 62/024,784, filed on Jul. 15, 2014, which are incorporated herein by reference.

FIELD OF THE INVENTION

This invention relates to interdigitated back contact (IBC) solar cells. More particularly, to systems and methods for fabricating IBCs.

BACKGROUND OF THE INVENTION

A desirable solar cell geometry referred to as an interdigitated back contact (IBC) cell comprises a semiconductor wafer and alternating lines (interdigitated stripes) of regions with p-type and n-type doping. This cell geometry has the advantage of eliminating shading losses altogether by putting both contacts on one side of the wafer. Further, contacts are easier to interconnect with both contacts on the rear. A laser-transfer process developed by Mei et al. at Xerox Palo Alto Research Center (PARC) is discussed in U.S. Pat. No. 5,871,826 entitled "Proximity Laser Doping Technique for Electronic Materials" was issued on Feb. 16, 1999. The patent describes a method of altering the electrical characteristics of a material through a laser ablation process, which can achieve high doping levels and shallow junctions at low temperatures. The invention utilizes a rapid interaction between a laser and a non-transparent thin source film deposited on a transparent plate (typically glass or quartz), which is placed in close proximity (typically about several microns) to a substrate. A process is described where a laser, such as a YAG laser, with a pulse duration of typically about 50 ns can be used to form a semiconductor junction with a depth of about 0.1 µm by using from 16 to 400 shots at a laser energy density ranging from 150 to 450 mJ/cm$^2$. This proximity laser ablation technique can be used to deposit thin films over a large area substrate at low temperature, and one may also use a mask to block off the laser energy in areas where deposition is not desirable.

More recently, Roder et al. (Proc. of the 35$^{th}$ IEEE Photovoltaic Specialists Conference, pp. 3597-3599, (2010)) at the University of Stuttgart used a similar process, which they called "Laser Transferred Contacts" (LTC) or "Laser Induced Forward Transfer" (LIFT) to laser transfer a thin layer of Ni through a silicon nitride antireflection coating to form a contact to a laser-doped selective emitter region. The laser-transferred Ni contact was then electroplated with 3 µm of Ni, and then plating continued with Cu to increase the conductivity of the fingers. With this technique, a 17.4% efficient silicon solar cell was fabricated with 30 µm wide finger contacts.

Scientists at the University of Stuttgart (Hoffmann et al., Proc. of the 38$^{th}$ IEEE Photovoltaic Specialists Conference, pp. 1059-1062 (2012)) also demonstrated a self-doping laser transferred contact process where Sb contacts were laser transferred through a silicon nitride antireflection coating to provide a self-aligned n-type selective emitter and simultaneously formed the contacts to the front side of the solar cell. The antimony doped contacts were used as a seed layer for subsequent nickel and copper plating, and were able to produce a fine line front metallization with a finger width of 20 µm and contact resistivity as low as 30 µΩ-cm$^2$ on a 110 Ω/sq. emitter. A green (532 nm) Nd:YAG laser was used with a pulse duration of 30 ns, as well as a green Nd:YVO$_4$ laser with a pulse duration of 6 ns, in conjunction with an optical system that shaped the beam into a line focus in order to minimize defect creation during the recrystallization of the Si. Contact lines with widths of ~7 µm were obtained, and Ni/Cu electroplating was used to increase the conductivity of the fingers. Solar cells with efficiencies as high as 17.5% were demonstrated.

Presently, Si solar cells with the highest efficiency are those based on combining an interdigitated all back contact structure with silicon heterojunction contacts. Panasonic recently reported obtaining a record conversion efficiency of 25.6% with such a device structure (Masuko et al., 40$^{th}$ IEEE Photovoltaic Specialists Conference, Jun. 8-13, 2014, Denver, Colo.). At the same conference, Sharp reported obtaining an efficiency of 25.1% with a similar device structure (Nakamura et al., 40$^{th}$ IEEE Photovoltaic Specialists Conference, Jun. 8-13, 2014, Denver, Colo.), and SunPower obtained an efficiency of 25.0% with an interdigitated back contact (IBC) silicon solar cell made using conventional diffusion processes (Smith et al., 40$^{th}$ IEEE Photovoltaic Specialists Conference, Jun. 8-13, 2014, Denver, Colo.). While the processing of these high efficiency IBC solar cells were not discussed in any detail, the manufacturing costs are likely to be relatively high since the processing in each case appears to be somewhat complicated with various masking and vacuum processing steps required.

Laser processing has also been used to fabricate relatively high efficiency silicon solar cells. Benick et al. (40$^{th}$ IEEE Photovoltaic Specialists Conference, Jun. 8-13, 2014, Denver, Colo.) obtained conversion efficiencies as high as 23.2% in a PERL (Passivated Emitter and Rear Locally-diffused) solar cell structure by laser doping localized rear contacts. In this process, a rear surface passivation layer consisting of a phosphorus-doped amorphous silicon carbide (a-SiC$_x$:P) as the doping source was utilized. The front surface emitter was formed by boron diffusion, and the front side contacts were formed using photolithography and evaporating a seed layer of Ti/Pd/Ag and then plating with Ag.

Dahlinger et al. (Energy Procedia 38, 250-253 (2013)) used laser doping to fabricate an interdigitated back contact silicon solar cell with an efficiency of 22.0%. A frequency doubled (532 nm) Nd:YAG-laser with a line shaped beam (<10 µm wide) and a pulse duration of ~50 ns was used. A thin boron precursor layer was sputtered on the rear side of the wafer, and then a laser doped p$^+$ emitter pattern was formed. After wet chemical cleaning, a lightly phosphorus doped region was formed on both sides of the wafer using POCl$_3$ furnace diffusion. Another laser doping process (utilizing the phosphosilicate glass grown during the POCl$_3$ diffusion as the doping source) was used to create the n$^+$ pattern on the rear side of the wafer. Thermal oxidation was used to drive in the diffused regions and to passivate the surface, and a plasma-enhanced chemical vapor deposited (PECVD) silicon nitride was used to form an anti-reflection coating on the front side and also an infrared reflection coating on the rear side of the wafer.

Hofmann et al. (Progress in Photovoltaics: Research and Applications; 16 509-518 (2008)) fabricated 21.7% Si solar cells used laser firing of Al through a rear surface passivation stack of amorphous silicon and PECVD silicon oxide to form localized p$^+$ contacts. The front surface emitter was formed using phosphorus diffusion at elevated temperatures, and a thermally oxidized anti-reflection coating was used that also served as front passivation layer. The front contacts were formed by evaporating a TiPdAg finger pattern.

While it is clear that laser processing can be used to make relatively efficient silicon solar cells, the processing used to date is somewhat complicated and in all cases uses some high temperature processing along with vacuum processing. High temperature processing can create defects in the silicon wafer, which can limit solar cell performance, and vacuum processing requires relatively expensive vacuum equipment, which can limit throughput and add to the manufacturing costs.

SUMMARY OF INVENTION

In one embodiment, interdigitated back contacts are formed in a passivated solar substrate by laser transferring both p+ and n+ finger pattern seed layers through the dielectric passivation using a laser transfer process with a narrow line-shaped laser beam. The seed layers may be plated with a conductive metal.

In another embodiment, a laser transfer process is used on a well-passivated solar substrate to fire p+ and n+ point contacts through the dielectric passivation. Another laser transfer process is then used to deposit an interdigitated finger pattern of an appropriate metal on top of the dielectric passivation and over the appropriate point contacts using a narrow line-shaped laser beam.

In yet another embodiment, a finger pattern is formed on a well-passivated solar substrate where most of the rear surface contains a tunnel oxide emitter by laser ablating the tunnel oxide emitter using line-shaped laser beams and laser transferring a base contact finger pattern.

In other embodiments, the laser transfer system may utilize either a narrow line-shaped laser beam or a small Gaussian laser beam, either of which can be temporally shaped, to either ablate, transfer a dopant, metal or other material; or laser-dope or laser fire localized p+ or n+ contacts.

The foregoing has outlined rather broadly various features of the present disclosure in order that the detailed description that follows may be better understood. Additional features and advantages of the disclosure will be described hereinafter.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

Figure 1:
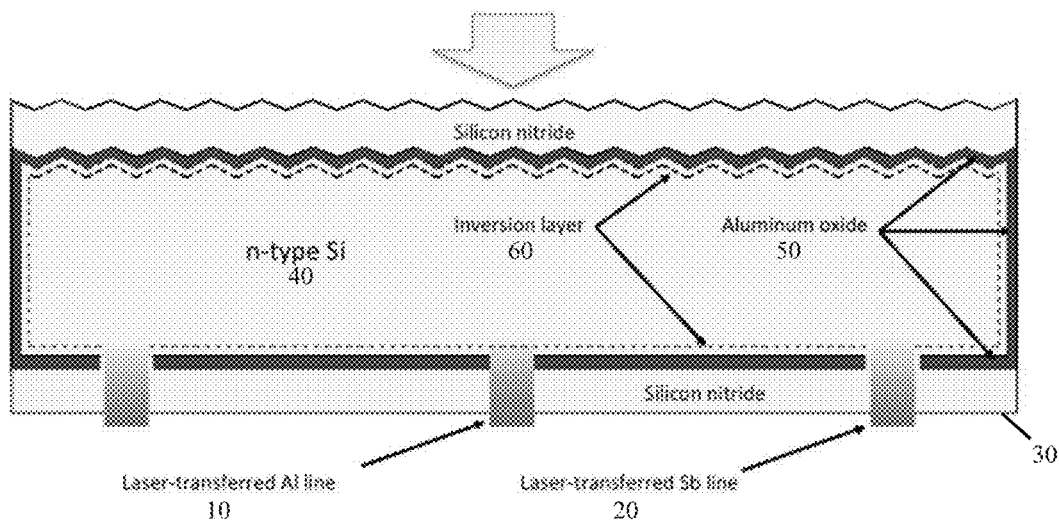
FIG. 1 is an illustrative embodiment of lines (e.g. Al and Sb) that are laser transferred through the passivation layers as interdigitated $p^+$ and $n^+$ finger patterns, respectively.

Refer now to the drawings wherein depicted elements are not necessarily shown to scale and wherein like or similar elements are designated by the same reference numeral through the several views.

Referring to the drawings in general, it will be understood that the illustrations are for the purpose of describing particular implementations of the disclosure and are not intended to be limiting thereto. While most of the terms used herein will be recognizable to those of ordinary skill in the art, it should be understood that when not explicitly defined, terms should be interpreted as adopting a meaning presently accepted by those of ordinary skill in the art.

It is to be understood that both the foregoing general description and the following detailed description are exemplary and explanatory only, and are not restrictive of the invention, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. Also, terms such as "element" or "component" encompass both elements or components comprising one unit and elements or components that comprise more than one unit unless specifically stated otherwise.

Systems and methods for producing high-performance interdigitated back contact (IBC) solar cells that are fabricated at low temperatures with low manufacturing costs using a laser-transfer process are discussed herein. The laser-transfer process may utilize spatially and/or temporally shaped laser beams. In some embodiments, the systems or methods discussed herein may have the following elements: (1) supply of dopants by a laser transfer process; (2) one or more dopants supplied by laser transfer process to avoid heating of the wafers to perform dopant diffusion; and/or (3) deposition in the processing of a back contact (IBC) cell. The use of line beams is a particularly attractive way to make an IBC cell since the electrodes of the IBC are thin lines, and thus interdigitated fingers can be patterned with a reduced number of laser pulse exposures. As a nonlimiting example, a Gaussian beam from a high power laser could be transformed into a long, narrow line-shaped beam using the appropriate optics. If the line beam is 1 cm long and 8 microns wide, then 15 pulses could be used to laser transfer conductive material for a single finger that is 15 cm long in an interdigitated finger pattern. If one used Gaussian beams 100 microns in diameter and they overlap by 10%, then it would take 1875 pulses to create a finger 15 cm long. Thus, the dramatic reduction (>99%) in pulses in readily apparent from the examples above. In some embodiments, the combination of (1)-(3) above may be utilized with line and/or temporal shaping.

The term "solar substrate" may be used herein to describe a silicon wafer that has been partially processed and will become a functional solar cell when all processing steps are completed. It should be understood that a solar substrate may sometimes be referred to as a solar cell below despite being in an intermediate state prior to the formation of a functional solar cell.

In some embodiments, the laser beam can be spatially shaped into a narrow line-shaped laser beam or into an array of very small diameter Gaussian laser beams (e.g. <20 μm or <10 μm). In some embodiments, the laser transfer process is a low heat process where the majority of the wafer remains at room temperature, and the laser energy is adjusted so that there is sufficient energy to transfer material to the wafer. In some embodiments, the low heat process may allow for localized heating of the wafer that is limited to temperatures well below the melting point of silicon (or equal to or less than 1,414° C.). As discussed above, work performed at the University of Stuttgart indicates that line-shaped laser beams with widths <10 μm exhibit little laser-induced damage, while conventional circular Gaussian laser beams (e.g. with diameters of ~30-130 μm) exhibit microcracks and dislocations. In some embodiments, the improved laser process discussed herein may utilize small diameter (<20 μm or <10 μm) Gaussian laser beams, which are also less likely to exhibit extended defects such as microcracks and dislocations due to the fact that only a very small region of Si is melted and recrystallized. In some embodiments, a pulsed line-shaped laser beams may be capable of processing about 150 meters or greater of finger length per second or about 1 silicon wafer or greater per second, which is approximately 100× greater processing throughput than with pulsed Gaussian laser beams.

In some embodiment, laser beams may be temporally shaped by scanning the laser system along the silicon wafer substrate and pulsing the laser a desired number of times to form a desired pattern, such as a finger pattern for interdigitated back contacts. The temporal pulse shape can be selected for the purposes of laser transfer of material, laser ablation or disruption of dielectric passivation layers, laser melting of selected localized regions of the Si wafer, laser doping of the melted Si regions with the appropriate dopant atoms, laser firing of contacting metals through the dielectric passivation layers and laser annealing of the localized treated regions on the Si wafer. Generally, laser transfer of material requires relatively short pulses (few ns to few tens of ns) while laser annealing requires relatively long pulses (0.1 μs to several μs). The pulse duration for laser doping will depend on the dopant depth required and can vary from tens of ns to hundreds of ns. As a nonlimiting example, a laser process which combines laser transfer, disruption of the dielectric passivation, melting, doping and annealing of the Si in a localized region might employ a line-shaped beam (e.g. 8 μm wide and 1 cm long) with the following temporally shaping: the pulse starts with an energy density of ~1 J/cm$^2$ over several ns to transfer the dopant material (e.g. Al) to the substrate (e.g. Si surface) and disrupt the dielectric passivation (e.g. 5 nm of ALD Al$_2$O$_3$/90 nm of PECVD SiO$_x$ on the rear surface); the energy density then falls to ~0.5 J/cm$^2$ over ~50 ns to locally melt the substrate surface and diffuse in the dopant; and then the pulse energy density decreases from 0.5 to 0.1 J/cm$^2$ over ~500 ns to anneal the localized region of substrate surface.

In a first embodiment, a passivated solar cell provides interdigitated back contacts that are formed by laser transferring both p$^+$ and n$^+$ finger pattern seed layers through the dielectric passivation using a laser transfer process with a narrow line-shaped laser beam, and then plating the seed layers with a conductive metal. For example, in some embodiments, the line-shaped laser beam may be <20 μm or <10 μm. FIG. 1 is an illustrative embodiment of lines 10, 20 that are laser fired or laser transferred through the passivation layers 30, 50 as interdigitated p$^+$ and n$^+$ finger patterns. As a nonlimiting example, the p$^+$ finger pattern seed layer 10 could be formed by laser transferring dopant materials under conditions where the laser beam disrupts the dielectric passivation layers 30, 50, melts the substrate 40 (e.g. Si) and diffuses the dopant into the substrate. Further, the n$^+$ finger pattern seed layer 20 could be formed by laser transferring dopant materials under conditions where the laser beam disrupts the dielectric passivation layers 30, 50, melts the substrate 40 (e.g. Si) and diffuses the dopant into the substrate. In the case of the n$^+$ finger pattern seed layer 20, the laser conditions could be selected to promote disruption of the dielectric passivation layers 30, 50 over a wider range so as to minimize current leakage from the inversion layer 60 created by the aluminum oxide 50 to the n$^+$ fingers (note the gap between the passivation layer 50 and n$^+$ seed layer 20 shown in FIG. 1). As nonlimiting examples, dopant materials may any suitable n- or p-type material, Al, Sb, Group III or V element, or the like. In the laser transfer process, the dopant atom is introduced on a donor substrate 40 containing or coated with a dopant material including the donor atom. The dopant material may be a pure form of the dopant, such as coatings of the group III or group V atoms. Alternatively, the dopant material may be a compound containing the dopant, such as an oxide, nitride, or chalcogenide of the donor. The dopant material may also be composed of a host material containing the dopant, such as amorphous silicon heavily doped with the dopant. Concentration of the dopant in the host material may be greater than 0.5%, preferably greater than 2%. The spacing of the interdigitated fingers in the laser-transferred line-contact IBC cells can be made relatively small (e.g. 100-300 microns), so that the lateral resistance (electrical shading) in the device is small.

In some embodiments, interdigitated back contact (IBC) silicon solar cells that are fabricated at low temperatures with low manufacturing costs using a laser-transfer process utilizing a narrow line-shaped laser beam or small diameter Gaussian laser beams. In some embodiment, the interdigitated back contacts for a well-passivated solar cell are formed by laser transferring both p$^+$ and n$^+$ finger pattern seed layers through the dielectric passivation using a laser transfer process with a narrow line-shaped laser beam, and then plating the seed layers with a conductive metal. In some embodiments, a laser transfer process is used on a well-passivated solar substrate to fire p$^+$ and n$^+$ point contacts through the dielectric passivation, and another laser transfer process is then used to deposit an interdigitated finger pattern of an appropriate metal on top of the dielectric passivation and over the appropriate point contacts using a narrow line-shaped laser beam. In some embodiments, most of the rear surface of a well passivated solar cell contains a tunnel oxide emitter interspersed with parallel lines of ohmic base contacts in a finger pattern formed by laser ablating the tunnel oxide emitter and a base contact finger pattern laser transferred using line-shaped laser beams. In various embodiments, the laser transfer system, which utilizes either a narrow line-shaped laser beam or a small Gaussian laser beam, either of which can be temporally shaped, can be utilized to ablate, transfer a dopant, metal or other material, and/or laser-dope or laser fire localized p$^+$ or n$^+$ contacts.

In some embodiments, the Al and Sb lines 10, 20 are laser transferred through the passivation layers 30, 50 as interdigitated p$^+$ and n$^+$ finger patterns, respectively. In some embodiments, the Al$_2$O$_3$ passivation layer 50 induces an inversion layer 60 which is in electrical contact with the laser-transferred Al emitter lines 10. In some embodiments, the laser-transferred Sb n$^+$ lines 20 are deposited under conditions that locally disrupt the Al$_2$O$_3$ layer 50 to prevent shunting. Further, laser ablation could also be used to locally remove the passivation layer 50 before laser transferring the Sb lines 20. In some embodiments, the seed layers could then be plated with a metal, such as Ni, Ti, or the like. Further, this may be optionally followed by plating with a more conductive metal, such as Al, Ag, Cu, or the like, to form a highly conductive interdigitated finger pattern.

Figure 2:
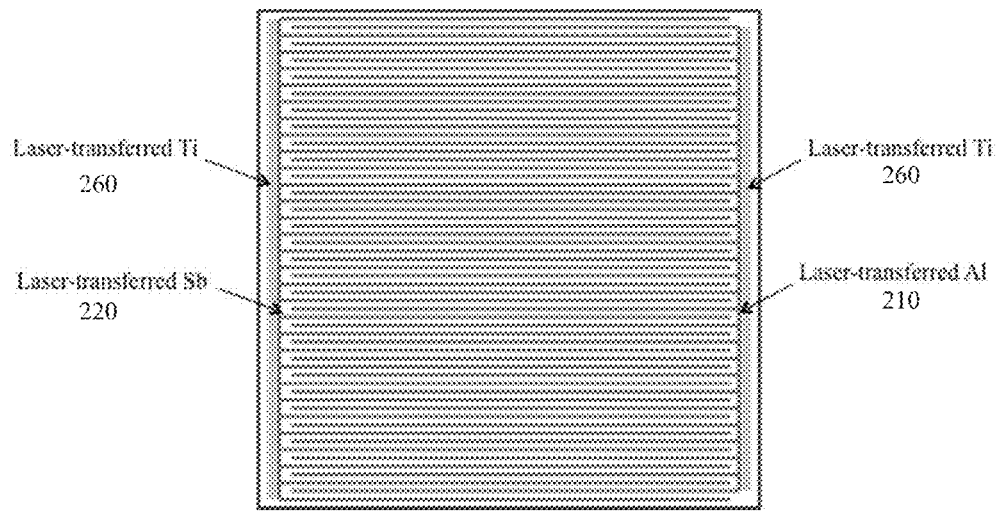
FIG. 2 is an illustrative embodiment of an interdigitated finger pattern formed utilizing seed layers.

FIG. 2 is an illustrative embodiment of an interdigitated finger pattern 210, 220 formed utilizing seed layers, such as seed layers shown in FIG. 1. As shown, the finger pattern provides alternating approximately parallel horizontal lines of different materials separated by a small gap, where one end of the horizontal lines of common materials are connected by a vertical line of matching material. In some embodiments, the dielectric passivation layers could comprise ALD $Al_2O_3$ and PECVD $SiO_x$:H on the rear surface. Subsequent to the laser transfer process, the solar cell can be annealed at moderate temperatures (200-450° C.) to improve the electrical properties of the contacts by promoting silicide formation and inducing atomic hydrogen motion from the PECVD $SiO_x$:H into the Si to passivate any laser-induced defects. In this example, Ti bus bar seed layers 260 are laser transferred at a low laser power so that they lie on top of the dielectric passivation layers. The laser-transferred Al 210 and Sb 220 lines, and the Ti bus bars 260 form the seed layers for plating of a conductive metal, such as Ag, Al or Cu.

Figure 3:
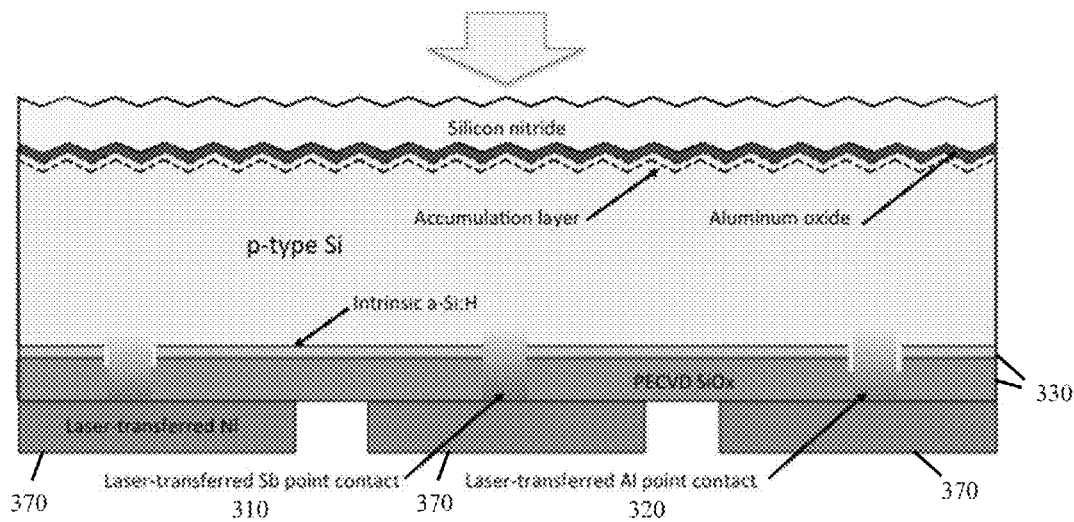
FIG. 3 is an illustrative embodiment of $n^+$ and $p^+$ point contacts made using a Gaussian laser beam to laser transfer small spots of n+ and p+ materials (e.g. Sb and Al), respectively, through the passivation layers.
Figure 4:
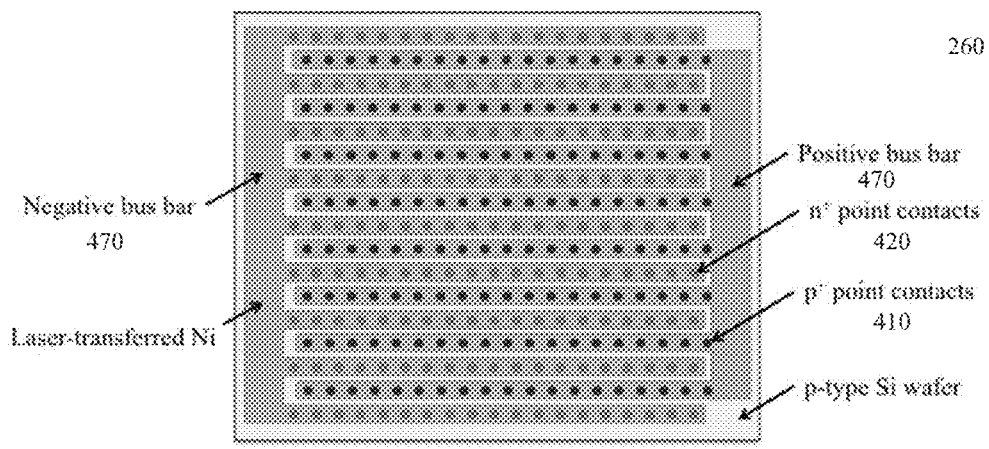
FIG. 4 is an illustrative embodiment showing an interdigitated seed layer (e.g. Ni) that is laser transferred on top of the passivation layers and on top of the $n^+$ and $p^+$ point contacts.

In another embodiment shown in FIG. 3, a laser transfer process is used on a passivated solar substrate to fire $p^+$ and $n^+$ point contacts 310, 320 through the dielectric passivation 330, and another laser transfer process is then used to deposit an interdigitated finger pattern of an appropriate metal 370 on top of the dielectric passivation and over the appropriate point contacts using a narrow line-shaped laser beam. FIG. 3 is an illustrative embodiment of $n^+$ and $p^+$ point contacts 310, 320 made using a Gaussian laser beam to laser transfer small spots of n+ and p+ materials, respectively, through the passivation layers 330. For example, in some embodiments, the Gaussian laser beam may be small diameter beam, such as <20 µm or <10 µm. If small diameter beams are used, then the density of small spots should be high enough to assure that the total contact resistance is less than 1 $\Omega$-cm$^2$. In some embodiments, the total area of all small spots should be equal to or greater than about 1% of the total rear surface area of the solar substrate. The same criterion also applies to line-shaped laser beams (i.e. the total area of all line-shaped contact regions should be greater than about 1% of the total rear surface area of the solar substrate). An interdigitated finger pattern is formed on the passivation by using a line-shaped laser beam to deposit a seed layer, which may be plated with a highly conductive metal. FIG. 4 is an illustrative embodiment showing an interdigitated seed layer 470 (e.g. Ni) that is laser transferred on top of the passivation layers and on top of the $n^+$ and $p^+$ point contacts 410, 420. In another embodiment, a finger pattern of n+ and p+ materials (e.g. Al and Sb) may be laser transferred under conditions where they lie on top of the dielectric passivation layers, and to then laser fire the $p^+$ and $n^+$ point contacts 410, 420 through the dielectric passivation layers. Yet another embodiment is to laser transfer the $n^+$ and $p^+$ point contacts 410, 420 before passivating the wafer, then laser transferring a Ni IBC pattern 470 on top of the dielectric passivation layers and then laser firing the Ni into the point contacts. However, this approach requires accurate alignment in order to laser fire the Ni into the point contacts.

As a nonlimiting example, the $n^+$ and $p^+$ point contacts are made using a Gaussian laser beam to laser transfer small spots of Sb and Al, respectively, through the passivation layers. An interdigitated finger pattern is formed on the passivation by using a line-shaped laser beam to deposit a seed layer of Ni, which is then plated with Cu. In this example, the rear surface passivation layers are a-Si:H/PECVD SiOx, which minimize shunting due to the lack of band bending. In this example, an interdigitated Ni seed layer is laser transferred on top of the passivation layers and on top of the $n^+$ and $p^+$ point contacts 410, 420. An alternative approach is to laser transfer a finger pattern of Al and an interdigitated finger pattern of Sb, and then to laser fire the point contacts 410, 420. Another approach is to laser transfer the $n^+$ and $p^+$ point contacts 410, 420 before passivating the wafer, then laser transferring a Ni IBC pattern and then laser firing the Ni into the point contacts.

Figure 5:
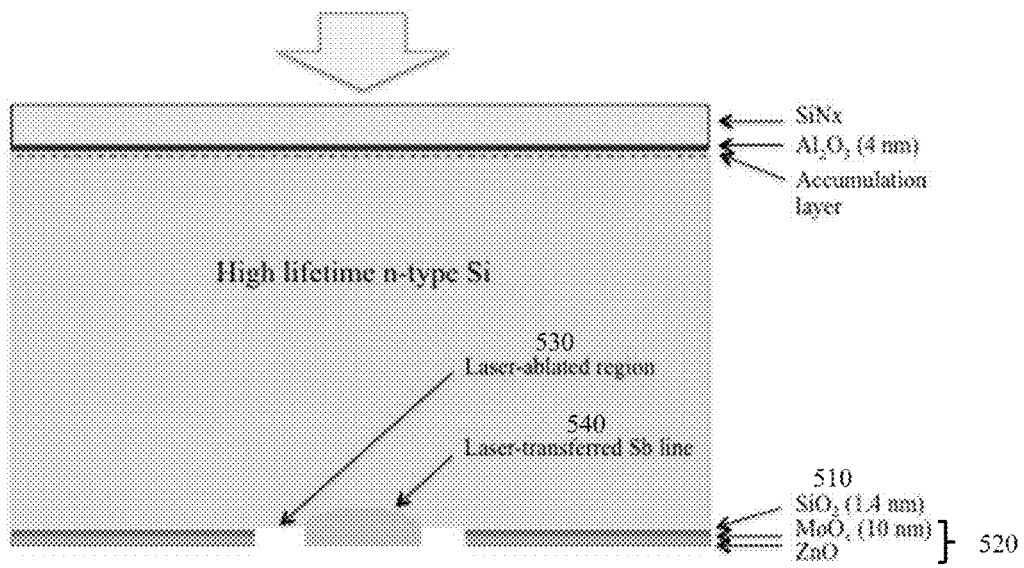
FIG. 5 is an illustrative embodiment of a device structure with a tunnel oxide emitter and where a laser beam is used to ablate a line region of a substrate and then to laser transfer a base dopant in a central region.

Another embodiment is a passivated solar cell where most of the rear surface contains a tunnel oxide emitter interspersed with parallel lines of ohmic base contacts in a finger pattern formed by laser ablating the tunnel oxide emitter and laser transferring a base contact finger pattern using line-shaped laser beams. While this embodiment discusses tunnel oxide emitters, other embodiments may provide a diffused emitter or an amorphous silicon heterojunction emitter. FIG. 5 is an illustrative embodiment where a tunnel oxide layer 510 is first deposited on the rear surface by atomic layer deposition, and then a thin layer of metal oxide(s) 520 (e.g. $MoO_x$ and ZnO) are then deposited. A line-shaped laser beam is used to ablate 530 a line region, and then a line 540 is laser transferred and doped in the central region (e.g. Sb). In some embodiments, it may be possible to laser transfer the Sb under conditions that locally disrupt the tunnel oxide layers beyond the doped region so that a separate laser ablation step is not required, thereby combining the above noted laser processing steps into one step. As shown in FIG. 5, the laser ablated 530 region is larger than the width of line 540 so that a separate laser ablation step is unnecessary to provide separation between the line 540 metal oxide(s) 520. In this case, both the tunnel oxide layers and the Sb base contact may be plated with conductive material (e.g. Ni/Cu) to increase the conductivity of the contacts.

For example, the tunnel oxide layers are first deposited on the rear surface by ALD. A line-shaped laser beam ablates a line region, and then a line of Sb is laser transferred and doped in the central region. Another possibility is to laser transfer the Sb under conditions that locally disrupt the tunnel oxide layers. The structure is annealed & Ni/Cu is plated to the Sb and the tunnel oxide layers.

In the example shown, the tunnel oxide emitter is shown as a thin (1.4 nm) $SiO_2$ layer coated with a high work function $MoO_x$ layer (10 nm thick) and topped with a conductive ZnO layer (~90 nm thick) to enhance the reflection from a subsequently plated rear metal contact. The $MoO_x$ layer could be replaced with p-type a-Si:H or another high work function material. For a p-type wafer, a low work function layer would be used. The tunnel oxide emitter would cover most of the rear surface (e.g. 95%) with the $n^+$ base line contacts covering ~5% (included any disrupted or ablated regions). Thus, the $n^+$ lines may be relatively thin (e.g. 8 microns wide) to minimize laser damage and spaced ~200 microns apart (the disrupted passivation regions might increase the effective line width to ~10 microns). The front surface of the laser-transferred line-contact IBC solar cells could be passivated with a high quality $Al_2O_3$ passivation layer to induce an accumulation layer (for p-type wafers) or an inversion layer (for n-type wafers). Since the spacing of the interdigitated fingers in the laser-transferred line-contact IBC cells is relatively small (e.g. 100-300 microns), the lateral resistance (electrical shading) in the device is small.

Figure 6:
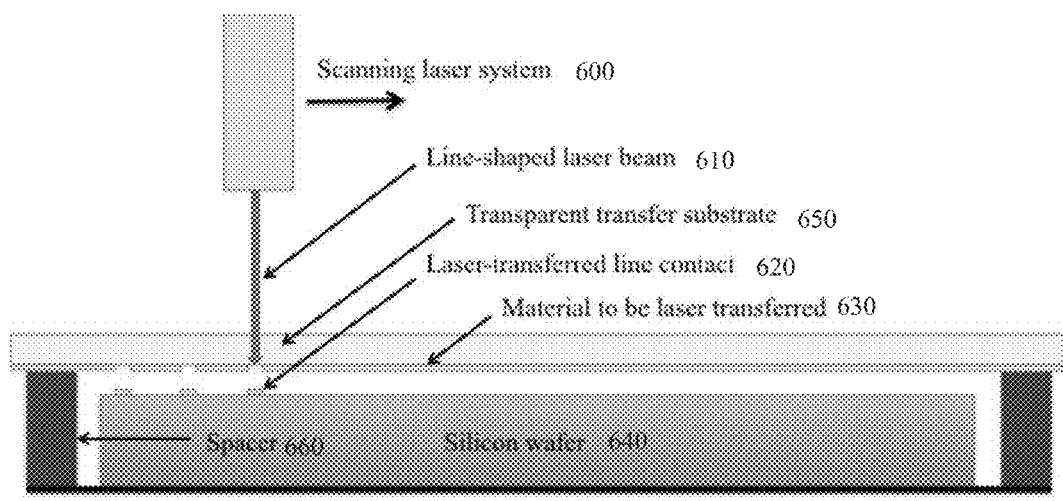
FIG. 6 is an illustrative embodiment of a schematic of a laser transfer system that utilizes a scanning line-shaped laser beam.

FIG. 6 is an illustrative embodiment of a schematic of a laser transfer system that utilizes a scanning laser 600 that provides a line-shaped beam 610. In yet another embodiment, a laser transfer system is provided, which utilizes either a narrow line-shaped laser beam or an array of small Gaussian laser beams (e.g. <20 μm or <10 μm), either of which can be temporally and/or spatially shaped, to either ablate; transfer a dopant, metal, or other material; or laser-dope or laser fire localized $p^+$ or $n^+$ contacts 620. This system uses the spatially/temporally shaped laser beams 610 to transfer and laser-fire (or laser dope) materials to be transferred 630, e.g. both $p^+$ and $n^+$ dopants, through a high quality dielectric passivation layer on a solar substrate 640 to form a low-cost, high-performance, interdigitated back-contact solar cell at low temperatures without the need for any vacuum processing equipment. The laser transfer system may comprise a laser beam 610 with a temporally adjustable pulse that is optimized to produce high quality localized emitters and base contacts 620. For example, as the system scans the substrate 640, the laser may be activated at desired times when the laser is above an area to be patterned to ablate, laser transfer materials, or laser dope the substrate in region-of-interest. The transparent transfer substrate 650 (e.g. a thin glass plate) is positioned and/or held a fixed distance from the Si wafer 640 (e.g. 5-50 microns) by a spacer 660. The transfer substrate 650 may provide regions deposited with one or more layers of various materials 630 (e.g. metals (e.g Sb, Al), dopant materials (e.g. spin-on phosphorus or boron containing inks), materials to aid ablation, etc.) so that the laser can either transfer the materials to the wafer 640 or ablate a dielectric surface on the Si wafer 640. In some embodiments, the transfer substrate 650 may not be coated with any materials or it may be removed, as it may not be necessary for processes involving ablation. By designing the system with interchangeable optics, one could laser transfer and dope $p^+$ and $n^+$ point contacts 620 and then switch to a low-power laser transfer of an interdigitated finger pattern that would lie on top of the dielectric passivation. The laser beam 610 can be scanned across the transparent transfer substrate 650 and the silicon wafer 640 to form the desired contact pattern on the surface of the wafer.

The laser transfer system can utilize multiple pulses in addition to temporally shaped pulses. For example, the first pulse could comprise a first section of relatively high energy density (e.g. ~1 j/cm$^2$) over 10 ns, and then a slowly decreasing section where the energy density decreases from 0.7 to 0.1 J/cm$^2$ over 500 ns. A second pulse to the same location might then be applied 10 μs later (100 kHz repetition rate) with an energy density ramping up to ~0.3 J/cm$^2$ over 10 ns, and then slowly decreasing to 0.05 J/cm$^2$ over 500 ns to further anneal the treated region. The wavelength of the laser beam can be in the IR (e.g. 1064 nm) for most applications, but a laser beam operating in the green (532 nm) can also be used and will more effectively heat just the top few μm of an exposed Si surface. The IR beam will initially heat the Si wafer to a depth of a few hundred μm, but as the laser rapidly heats up the Si locally, the absorption coefficient in the IR increases rapidly and the heating becomes localized near the surface region.

In some embodiments, the transfer substrate 650 of the laser transfer system can be coated with multiple layers depending on the application. For example, the laser transfer substrate 650 may be first coated with a thin easily evaporated material 630 (e.g. a-Si:H) to act as a release layer for a refractory material (e.g. Mo) or a transparent material (e.g. SiO$_2$) deposited on the a-Si:H. Another nonlimiting example involves first depositing a layer of Ni on the laser transfer substrate followed by a layer of Sb so that the laser will transfer Sb for $n^+$ doping and Ni for a low-resistance nickel silicide contact.

For example, the laser transfer system may use a narrow line-shaped laser beam and/or small Gaussian laser beams to transfer and laser-fire (or laser dope) both $p^+$ and $n^+$ dopants through a high quality dielectric passivation layer to form a low-cost, high-performance, interdigitated back-contact solar cell at low temperatures without the need for any vacuum processing equipment. The laser transfer system comprises a laser beam with a temporally adjustable pulse. The transparent transfer substrate (e.g. a thin glass plate) is held a fixed distance from the Si wafer (e.g. 5-50 microns) and can be moved between regions containing materials, such as Sb, Al or no coating, so that the laser can either transfer materials (e.g. Sb or Al) or ablate a dielectric surface on the Si wafer. By designing the system with interchangeable optics, one could laser transfer and dope $p^+$ and $n^+$ point contacts and then switch to a low-power laser transfer of an interdigitated finger pattern that would lie on top of the dielectric passivation. The laser beam can be scanned across the transparent transfer substrate and the silicon wafer to form the desired contact pattern on the surface of the wafer. The conductivity of the transferred contact pattern can be increased by plating the seed layers with a conductive metal such as Al, Ag or Cu. The laser transfer substrate may be first coated with a thin easily evaporated material (e.g. a-Si:H) to act as a release layer for a refractory material (e.g. Mo) or a transparent material (e.g. SiO$_2$) deposited on the a-Si:H.

There are several advantages to laser-transfer processing. First, narrow line-shaped or very small diameter circular laser beams create less laser-induced damage than conventional Gaussian laser beams. Further, the processing throughput can be increased by about 100× with a line-shaped laser beam over that obtained with pulsed or Gaussian laser beams. The processing throughput can be further increased by using diffractive optics or beam splitting optics in conjunction with a powerful laser to control the shape of the line-shaped laser beams or Gaussian laser beams and/or to create multiple parallel line-shaped beams or multiple small diameter Gaussian beams. The laser-transferred line contacts can be closely spaced (e.g. 100-300 microns) so that lateral resistance in the IBC solar cells is minimized. Processing costs can be reduced since the laser processing system has a smaller factory footprint and uses far less energy than conventional diffusion furnaces. Dangerous chemicals such as POCl$_3$ and BBr$_3$ can be eliminated. Processing yields will increase since the laser-transfer process takes place at room temperature with minimal wafer handling. Ongoing advances in laser technology should continue to increase the power of laser processing systems and to decrease the cost.

Embodiments described herein are included to demonstrate particular aspects of the present disclosure. It should be appreciated by those of skill in the art that the embodiments described herein merely represent exemplary embodiments of the disclosure. Those of ordinary skill in the art should, in light of the present disclosure, appreciate that many changes can be made in the specific embodiments described and still obtain a like or similar result without departing from the spirit and scope of the present disclosure. From the foregoing description, one of ordinary skill in the art can easily ascertain the essential characteristics of this disclosure, and without departing from the spirit and scope thereof, can make various changes and modifications to adapt the disclosure to various usages and conditions. The embodiments described hereinabove are meant to be illustrative only and should not be taken as limiting of the scope of the disclosure.

What is claimed is:

1. A laser transfer system for transferring materials to a solar substrate for a back-contact solar cell, the system comprising:
    a transfer substrate coated with at least one material to be transferred to a solar substrate, wherein the solar substrate provides at least one passivation layer on a rear surface;
    a spacer separating the transfer substrate from the solar substrate by a predetermined distance; and
    a scanning laser that can produce line-shaped laser beams or Gaussian laser beams, wherein the scanning laser disrupts the passivation layer and transfers the at least one material to the solar substrate to form a finger pattern.

2. The system of claim 1, wherein the line-shaped laser beam has a width less than 20 microns or the Gaussian laser beam has a diameter less than 20 microns.

3. The system of claim 1, wherein the at least one material of the transfer substrate comprises a dopant that is transferred by the scanning laser to the solar substrate to form the finger pattern.

4. The system of claim 3, wherein the scanning laser produces localized $n^+$ and $p^+$ point contacts in the finger pattern.

5. The system of claim 3, wherein the at least one material of the transfer substrate further comprises a layer of conductive metal, the scanning laser transfers the conductive metal from the transfer substrate to the solar substrate, and the conductive metal is deposited on top of the dopant in the finger pattern.

6. The system of claim 5, wherein the laser transfer system creates an interdigitated back contact (IBC) solar cell from the solar substrate.

7. The system of claim 6, wherein interdigitated fingers of the IBC solar cell are spaced apart by equal to or between 100-300 microns.

8. The system of claim 1, wherein the scanning laser ablates localized regions of at least one passivation layer and an emitter of the solar cell.

9. The system of claim 1, wherein the line-shaped laser beams or Gaussian laser beams are temporally shaped.

10. The system of claim 1, wherein the system provides interchangeable optics.

11. The system of claim 1, further comprising:
    diffractive optics for the scanning laser system, wherein the diffractive optics allow control of a shape of the line-shaped laser beams or Gaussian laser beams or provide a plurality of the line-shaped laser beams or Gaussian laser beams, or
    beam splitting optics for the scanning laser system, wherein the beam splitting optics to create a plurality of the line-shaped laser beams or multiple Gaussian laser beams.

12. The system of claim 1, wherein the line-shaped laser beams or Gaussian laser beams are pulsed at predetermined times as the scanning laser system passes along the solar substrate to form the finger pattern.

13. The system of claim 1, wherein the scanning laser system produces the line-shaped laser beams, and the laser system is capable of processing about 1 solar substrate per second.

14. The system of claim 1, wherein the solar substrate provides an emitter overcoated by the at least one passivation layer, and a laser activation step ablates the at least one passivation layer and the emitter.

15. The system of claim 14, wherein the emitter is a diffused emitter, a tunnel oxide emitter, or an amorphous silicon heterojunction emitter.

16. The system of claim 1, wherein the transfer substrate is coated with a release layer to expedite the transfer of the at least one material to the solar substrate.

17. The system of claim 1, wherein the transfer substrate is 5-50 microns from the solar substrate.

18. The system of claim 1, wherein the scanning laser transfers the at least one material to the solar substrate by applying a first initial high energy pulse where energy decreases over a set period of time.

19. The system of claim 18, wherein the scanning laser further applies a second pulse with an initial energy ramp up and subsequent energy decrease to anneal.

20. The system of claim 1, wherein a wavelength of the scanning laser is in infrared (IR) wavelengths or green wavelengths.

* * * * *